US010084126B1

(12) United States Patent
Quinsat et al.

(10) Patent No.: US 10,084,126 B1
(45) Date of Patent: Sep. 25, 2018

(54) MAGNETIC MEMORY DEVICE

(71) Applicant: TOSHIBA MEMORY CORPORATION, Tokyo (JP)

(72) Inventors: Michael Arnaud Quinsat, Yokohama Kanagawa (JP); Takuya Shimada, Kawasaki Kanagawa (JP); Tsuyoshi Kondo, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/661,026

(22) Filed: Jul. 27, 2017

(30) Foreign Application Priority Data

Mar. 16, 2017 (JP) .................................. 2017-051266

(51) Int. Cl.
*G11C 19/00* (2006.01)
*H01L 43/02* (2006.01)
(Continued)

(52) U.S. Cl.
CPC ............ *H01L 43/02* (2013.01); *G11C 11/161* (2013.01); *G11C 11/1673* (2013.01);
(Continued)

(58) Field of Classification Search
CPC ......... H01L 43/02; H01L 43/08; H01L 43/10; G11C 11/161; G11C 11/1673; G11C 11/1675; G11C 19/02
(Continued)

(56) References Cited

U.S. PATENT DOCUMENTS 6,898,132 B2 5/2005 Parkin
7,952,905 B2 5/2011 Hwang
(Continued)

FOREIGN PATENT DOCUMENTS

JP 2008-251796 10/2008
JP 2010-161362 7/2010
JP 2017-59595 3/2017

OTHER PUBLICATIONS

Safeer et al., "Spin-orbit torque magnetization switching controlled by geometry," Nature Nanotechnology (Feb. 2016), 11:143-147.
(Continued)

*Primary Examiner* — Huan Hoang
(74) *Attorney, Agent, or Firm* — Finnegan, Henderson, Farabow, Garrett & Dunner, L.L.P.

(57) ABSTRACT

According to one embodiment, a magnetic memory device includes first and second magnetic members, and a conductive member. The first magnetic member includes first, second, and third extending portions. The first extending portion extends along a first direction. The second extending portion extends along a second direction. The third extending portion includes a third connection portion connected with the first and second extending portions. The third extending portion extends along a third direction. The conductive member extends along a fourth direction. The first and second directions are inclined with respect to the fourth direction. The conductive member includes a portion overlapping at least parts of the first and second extending portions in a fifth direction. The fifth direction crosses the first, the second and the fourth directions. The conductive member includes a metal. A direction from the third extending portion toward the second magnetic member crosses the third direction.

19 Claims, 15 Drawing Sheets

(51) Int. Cl.
*H01L 43/10* (2006.01)
*H01L 43/08* (2006.01)
*G11C 11/16* (2006.01)
*G11C 19/02* (2006.01)

(52) U.S. Cl.
CPC .......... *G11C 11/1675* (2013.01); *G11C 19/02* (2013.01); *H01L 43/08* (2013.01); *H01L 43/10* (2013.01)

(58) Field of Classification Search
USPC .................................................. 365/80, 158
See application file for complete search history.

(56) References Cited

U.S. PATENT DOCUMENTS

| | | |
|---|---|---|
| 8,009,453 B2 | 8/2011 | Gaidis |
| 8,130,531 B2 | 3/2012 | Tsai |
| 8,233,305 B2 | 7/2012 | Lee |
| 2016/0379701 A1* | 12/2016 | Nakatsuka .......... G11C 11/1659 365/51 |

OTHER PUBLICATIONS

Chenattukuzhiyil, "Study of domain wall dynamics in the presence of large spin-orbit coupling: chiral damping and magnetic origami," Physics, Universite Grenoble Alpes (2015), pp. 1-129.

* cited by examiner

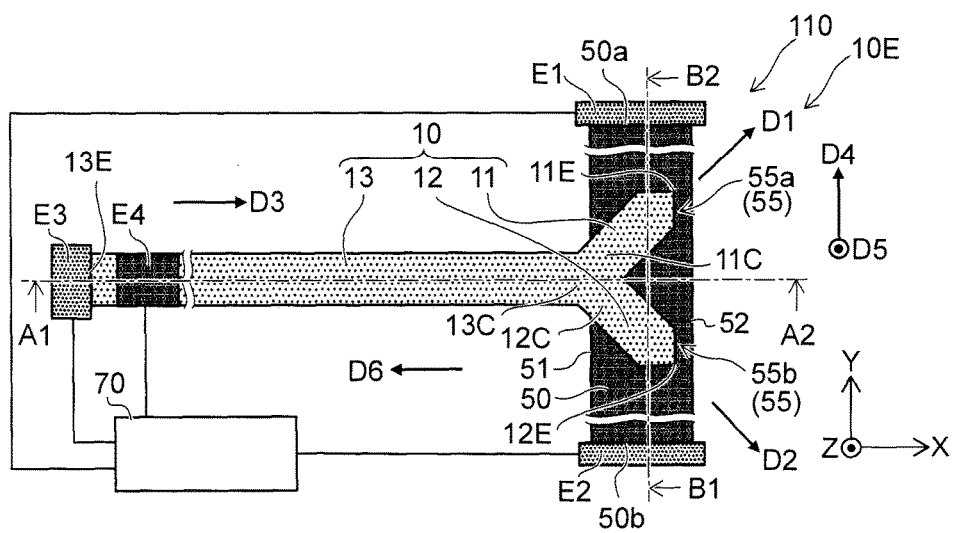
FIG. 1A
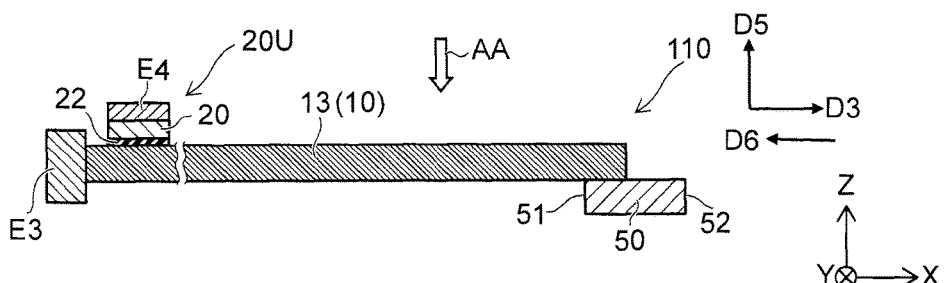
FIG. 1B
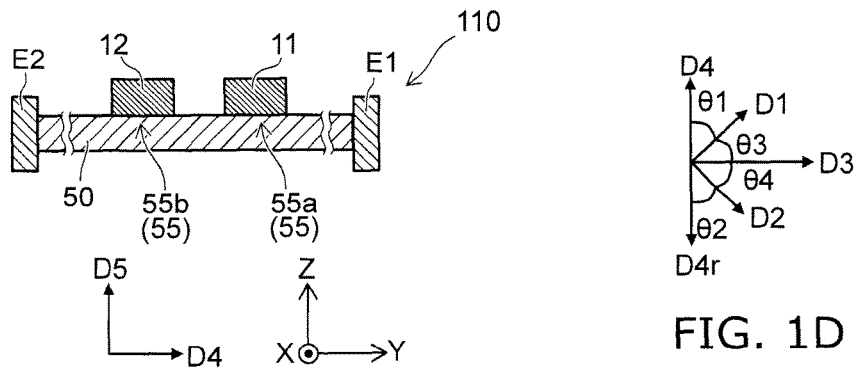
FIG. 1C
FIG. 1D

US 10,084,126 B1

MAGNETIC MEMORY DEVICE

CROSS-REFERENCE TO RELATED APPLICATIONS

This application is based upon and claims the benefit of priority from Japanese Patent Application No. 2017-051266, filed on Mar. 16, 2017; the entire contents of which are incorporated herein by reference.

FIELD

The embodiment of the present invention is generally related to a magnetic memory device.

BACKGROUND

There is a magnetic memory device including the magnetic shift register using a magnetic body. The stable operation in the magnetic memory device is demanded.

BRIEF DESCRIPTION OF THE DRAWINGS

FIG. 1A to FIG. 1D are schematic views illustrating a magnetic memory device according to a first embodiment;

DETAILED DESCRIPTION

Figure 2A:
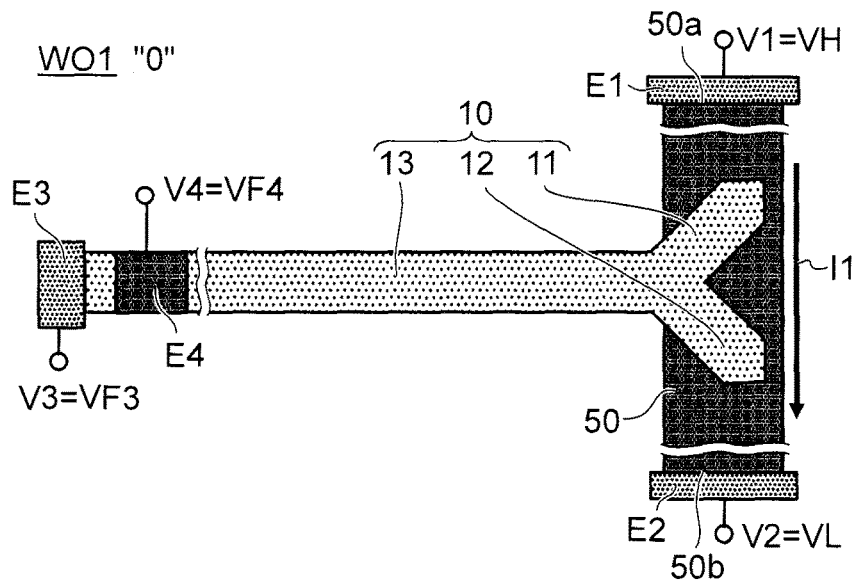
FIG. 2A and FIG. 2B are schematic views illustrating operations in the magnetic memory device according to the first embodiment.

According to one embodiment, a magnetic memory device includes a first magnetic member, a conductive member, and a second magnetic member. The first magnetic member includes a first extending portion, a second extending portion, and a third extending portion. The first extending portion extends along a first direction. The second extending portion extends along a second direction different from the first direction. The third extending portion includes a third connection portion connected with the first extending portion and the second extending portion. The third extending portion extends along a third direction. The conductive member extends along a fourth direction. The first direction is inclined with respect to the fourth direction. The second direction is inclined with respect to the fourth direction. The conductive member includes an overlapping portion. The overlapping portion overlaps at least a part of the first extending portion and at least a part of the second extending portion in a fifth direction. The fifth direction crosses the first direction, the second direction and the fourth direction. The conductive member includes a metal. A direction from the third extending portion toward the second magnetic member crosses the third direction.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the present specification and drawings, the same elements as those described previously with reference to earlier figures are labeled with like reference numerals, and the detailed description thereof is omitted as appropriate.

First Embodiment

FIG. 1A to FIG. 1D are schematic views illustrating a magnetic memory device according to a first embodiment.

FIG. 1A is a plan view seen from the arrow AA of FIG. 1B. FIG. 1B is an A1-A2 line sectional view of FIG. 1A. FIG. 1C is a B1-B2 line sectional view of FIG. 1A. FIG. 1D is a schematic view showing angles.

As shown in these figures, the magnetic memory device 110 according to the embodiment includes a first magnetic member 10, a conductive member 50, and a second magnetic member 20. In this example, the magnetic memory device 110 further includes a controller 70. The first magnetic member 10, the conductive member 50, and the second magnetic member 20 are included in an element portion 10E. The element portion 10E corresponds to a memory part. The controller 70 controls the element portion 10E.

The first magnetic member 10 includes a first extending portion 11, a second extending portion 12, and a third extending portion 13. The first extending portion 11 extends along a first direction D1. The second extending portion 12 extends along a second direction D2. The second direction D2 differs from the first direction D1. The third extending portion 13 includes a third connection portion 13C. The third connection portion 13C is connected with the first extending portion 11 and the second extending portion 12. The third extending portion 13 extends along a third direction D3.

For example, the third extending portion 13 further includes a third end portion 13E. A direction connecting the third end portion 13E and the third connection portion 13C is along the third direction D3.

For example, the first extending portion 11 includes a first connection portion 11C and a first end 11E. For example, the second extending portion 12 includes a second connection portion 12C and a second end 12E. The first connection portion 11C is connected with the third connection portion 13C. The second connection portion 12C is connected with the third connection portion 13C. The first connection portion 11C is located between the third connection portion 13C and the first end 11E. The second connection portion 12C is located between the third connection portion 13C and the second end 12E. The third connection portion 13C is located between the first connection portion 11C and the third end portion 13E. The third connection portion 13C is located between the second connection portion 12C and the third end portion 13E.

The conductive member 50 extends in a fourth direction D4. The first direction D1 is inclined with respect to the fourth direction D4. The second direction D2 is inclined with respect to the fourth direction D4. The conductive member 50 includes an overlapping portion 55.

As shown in FIG. 1A and FIG. 1C, the overlapping portion 55 overlaps at least a part of the first extending portion 11 in a fifth direction D5. The overlapping portion 55 overlaps at least a part of the second extending portion 12 in the fifth direction D5. The fifth direction D5 crosses the first direction D1, the second direction D2, and the fourth direction D4.

Thus, the overlapping portion 55 includes a first overlapping region 55a and a second overlapping region 55b. The first overlapping region 55a overlaps at least a part of the first extending portion 11 in the fifth direction D5. The second overlapping region 55b overlaps at least a part of the second extending portion 12 in the fifth direction D5.

For example, a direction perpendicular to the first direction D1 and the second direction D2 is taken as a Z-axis direction. A direction perpendicular to the Z-axis direction is taken as an X-axis direction. A direction perpendicular to the Z-axis direction and the X-axis direction is taken as a Y-axis direction.

The fifth direction D5 is along the Z-axis direction, for example. In this example, the third direction D3 is along an X-Y plane. In this example, the fourth direction D4 is along the X-Y plane.

The conductive member 50 includes a metal. As mentioned below, a magnetic action works between the conductive member 50 and the first extending portion 11, for example. For example, a magnetic action works between the conductive member 50 and the second extending portion 12. For example, when a current flows in the conductive member 50, magnetic characteristic in at least one of the first extending portion 11 and the second extending portion 12 changes. For example, a magnetization direction changes. The change of the magnetization is transferred to the third extending portion 13. The magnetization is held in the third extending portion 13. The third extending portion 13 functions as a shift register, for example. Information is held at the third extending portion 13. For example, the first extending portion 11 and the second extending portion 12 function as a writing part of information. For example, information is written in the first extending portion 11 or in the second extending portion 12 by the conductive member 50.

As shown in FIG. 1B, the second magnetic member 20 opposes the third extending portion 13. A direction from the third extending portion 13 toward the second magnetic member 20 crosses the third direction D3. In this example, the second magnetic member 20 is apart from the third extending portion 13 along the Z-axis direction.

In this example, an intermediate member 22 is provided between the second magnetic member 20 and the third extending portion 13. The intermediate member 22 is non-magnetic, for example. The intermediate member 22 includes MgO, for example.

The second magnetic member 20, the intermediate member 22, and a part of the third extending portion 13 form an MTJ (Magnetic Tunnel Junction), for example. The second magnetic member 20 and the intermediate member 22 function as at least a part of a reading part 20U, for example. For example, the characteristic (for example, electrical resistance) of the reading part 20U changes depending on the magnetic characteristic of the third extending portion 13.

In the magnetic memory device 110 according to the embodiment, the first extending portion 11 and the second extending portion 12 are provided. These two portions function as a writing part. The directions in which these two portions extend are different from each other. Thereby, as mentioned later, the writing of first information and second information can be performed stably.

As shown in FIG. 1A, the first extending portion 11 and the second extending portion 12 overlap the overlapping portion 55 in the Z-axis direction. On the other hand, in this example, the third connection portion 13C does not overlap the overlapping portion 55 in the Z-axis direction. Thereby, the conductive member 50 does not affect the magnetization of the third connection portion 13C substantially, for example. In addition, the conductive member 50 affects the magnetization of the first extending portion 11, or the magnetization of the second extending portion 12, for example. Thereby, more stable writing operation can be performed.

As shown in FIG. 1D, a first angle $\theta 1$ is taken as an angle between the first direction D1 and the fourth direction D4. A second angles $\theta 2$ is taken as an angle between the second direction D2 and an opposite direction of the fourth direction D4.

In the embodiments, these angles (absolute value of an angle) may be substantially the same as each other. For example, a difference of the first angle $\theta 1$ and the second angle $\theta 2$ is not more than 10 degrees. For example, the difference of the absolute value of the first angle $\theta 1$ and the absolute value of the second angle $\theta 2$ is not more than 10 degrees.

For example, the absolute value of the first angle $\theta 1$ is not less than 10 degrees and not more than 80 degrees. For example, the absolute value of the second angle $\theta 2$ is not less than 10 degrees and not more than 80 degrees. For example, the absolute value of the first angle $\theta 1$ may be not less than 30 degrees and not more than 60 degrees. For example, the absolute value of the second angle $\theta 2$ may be not less than 30 degrees and not more than 60 degrees.

For example, a third angle $\theta 3$ is taken as an angle between the first direction D1 and the third direction D3. A fourth angle $\theta 4$ is taken as an angle between the second direction D2 and the third direction D3. For example, these angles (absolute value of angle) may be substantially the same as each other. For example, a difference of the third angle $\theta 3$ and the fourth angle $\theta 4$ is not more than 10 degrees. For example, the absolute value of the third angle $\theta 3$ may be not less than 30 degrees and not more than 60 degrees. For example, the absolute value of the fourth angle θ4 may be not less than 30 degrees and not more than 60 degrees.

As shown in FIG. 1A, the conductive member 50 has a first side 51 and a second side 52. The first side 51 extends along the fourth direction D4. The second side 52 extends along the fourth direction D4. The second side 52 is an outside side, for example.

For example, a sixth direction D6 crosses the first direction D1, the second direction D2, and the fourth direction D4. The sixth direction D6 is substantially perpendicular to the fifth direction D5. For example, an angle between the sixth direction D6 and the fifth direction D5 is not less than 85 degrees and not more than 95 degrees. The sixth direction D6 is along the X-axis direction, for example.

As shown in FIG. 1A, in this example, the position in the sixth direction D6 of the first side 51 is located between the position in the sixth direction D6 of the third extending portion 13 and the position in the sixth direction D6 of the second side 52, for example.

For example, the position in the sixth direction D6 of the first end 11E is located between the position in the sixth direction D6 of the first side 51 and the position in the sixth direction D6 of the second side 52. The position in the sixth direction D6 of the second end 12E is located between the position in the sixth direction D6 of the first side 51 and the position in the sixth direction D6 of the second side 52.

As shown in FIG. 1B, in this example, the second magnetic member 20 is provided on the third extending portion 13 (first magnetic member 10). The conductive member 50 is provided under the first magnetic member 10. For example, the position in the fifth direction D5 of the first magnetic member 10 is located between the position in the fifth direction D5 of the second magnetic member 20 and the position in the fifth direction D5 of the conductive member 50.

As shown in FIG. 1A, the conductive member 50 includes a first end portion 50a and a second end portion 50b. The overlapping portion 55 is located between the first end portion 50a and the second end portion 50b. A direction from the second end portion 50b toward the first end portion 50a is along the fourth direction D4.

In this example, a first electrode E1, a second electrode E2, a third electrode E3, and a fourth electrode E4 are provided. The first electrode E1 is electrically connected with the first end portion 50a. The second electrode E2 is electrically connected with the second end portion 50b. The third electrode E3 is electrically connected with the third end portion 13E. The fourth electrode E4 is electrically connected with the second magnetic member 20. The controller 70 is electrically connected with these electrodes, for example. Thereby, for example, the controller 70 is electrically connected with the first end portion 50a and the second end portion 50b. For example, the controller 70 is electrically connected with the third end portion 13E. For example, the controller 70 is electrically connected with the second magnetic member 20.

Hereinafter, examples of operations in the magnetic memory device 110 are described. The following operations are performed by the controller 70.

Figure 2B:
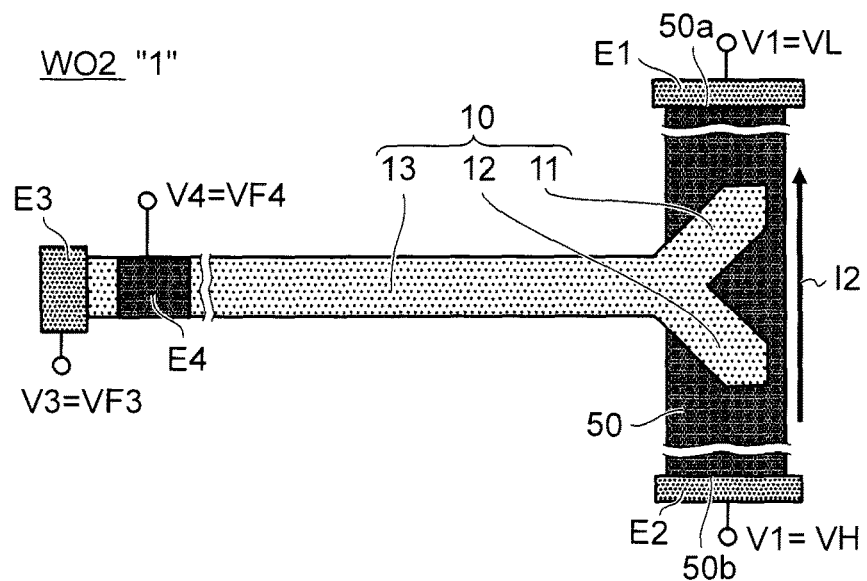

FIG. 2A and FIG. 2B are schematic views illustrating the operation in the magnetic memory device according to the first embodiment.

FIG. 2A corresponds to a first writing operation WO1. FIG. 2B corresponds to a second writing operation WO2. The first writing operation WO1 corresponds to writing of the information of "0", for example. The second writing operation WO2 corresponds to writing of the information of "1", for example. The first writing operation WO1 may correspond to the writing of the information of "1", and the second writing operation WO2 may correspond to the writing of the information of "0."

As shown in FIG. 2A, the controller 70 supplies a first current I1 to the conductive member 50 in first writing operation WO1. As shown in FIG. 2B, the controller 70 supplies a second current I2 to the conductive member 50 in the second writing operation WO2.

In this example, a direction of the first current I1 is from the first end portion 50a toward the second end portion 50b. A direction of the second current I2 is from the second end portion 50b toward the first end portion 50a.

For example, in the first writing operation WO1, the first electrode E1 is set at a high potential VH. In the first writing operation WO1, the second electrode E2 is set at a low potential VL. The low potential VL is lower than the high potential VH. On the other hand, in the second writing operation WO2, the first electrode E1 is set at the low potential VL. In the second writing operation WO2, the second electrode E2 is set at the high potential VH.

In these writing operations, a potential of the third electrode E3 is arbitrary. For example, the third electrode E3 may be at a floating potential VF3. In these writing operations, a potential of the fourth electrode E4 is arbitrary. For example, the fourth electrode E4 may be at a floating potential VF4.

A first state formed in the third extending portion 13 in the first writing operation WO1 differs from a second state formed in the third extending portion 13 in the second writing operation WO2.

For example, a first magnetization is formed in the third extending portion 13 in the first writing operation WO1. On the other hand, a second magnetization is formed in the third extending portion 13, for example, in the second writing operation WO2. The second magnetization differs from the first magnetization. For example, the first magnetization is either "upward" or "downward." The second magnetization is another of "upward" and "downward." These different magnetizations correspond to the information memorized.

In the embodiments, the above-mentioned first current I1 and the second current I2 act onto the first extending portion 11 and the second extending portion 12, such action being induced by spin hall effect occurring in the conductive member 50, for example. Thereby, magnetic domains are transferred to the third extending portion 13 from either the first extending portion 11 or the second extending portion 12. In the embodiment, the directions (the first direction D1 and the second direction D2) where the first extending portion 11 and the second extending portion 12 extend are inclined with respect to the fourth direction D4 where the conductive member 50 extends. In addition, the first direction D1 differs from the second direction D2. Therefore, for example, the flow of the magnetic domain generated in the first extending portion 11 differs from the flow of the magnetic domain generated in the second extending portion 12. Therefore, either of the first extending portion 11 or the second extending portion 12 becomes to have a priority. Thereby, magnetic domains can be stably transferred to the third extending portion 13.

Thereby, the writing operation becomes stable. According to embodiment, the magnetic memory device in which the stable operation is possible can be provided.

Hereinafter, an example of moving of the magnetic domain in a magnetic member extending along one direction will be described.

Figure 3A:
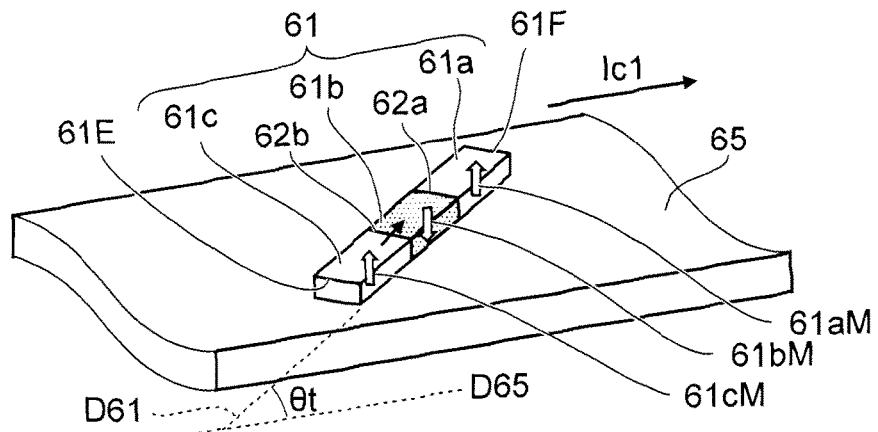
FIG. 3A and FIG. 3B are schematic perspective views illustrating operations in a magnetic memory device.
Figure 3B:
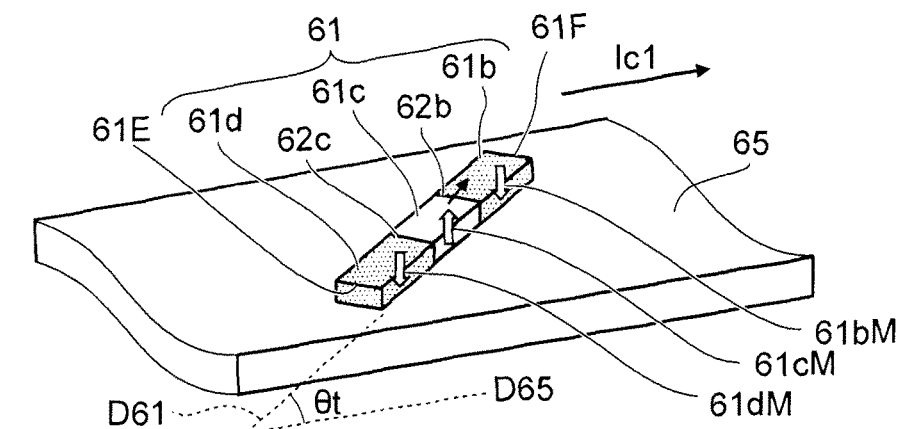

FIG. 3A and FIG. 3B are schematic perspective views illustrating operations in a magnetic memory device.

A magnetic member 61 and a conductor 65 are provided. The conductor 65 extends along a direction D65. The magnetic member 61 is provided on the conductor 65. The magnetic member 61 extends along a direction D61 from one end 61E to other one end 61F. The direction D61 is inclined with respect to the direction D65. A difference of the direction D61 and the direction D65 is taken as a tilt angle θt.

As shown in FIG. 3A, the magnetic member 61 has a plurality of magnetic domains (a first magnetic domain 61a, a second magnetic domain 61b, a third magnetic domain 61c, etc.). A first magnetic domain wall 62a is located between the first magnetic domain 61a and the second magnetic domain 61b. A second magnetic domain wall 62b is located between the second magnetic domain 61b and the third magnetic domain 61c. For example, a magnetization 61aM in the first magnetic domain 61a and a magnetization 61cM in the third magnetic domain 61c are upward. On the other hand, a magnetization 61bM in the second magnetic domain 61b is downward.

A current Ic1 flows in the conductor 65. The current is along the direction D65. By the current Ic1 flowing in the conductor 65, spin orbit torque occurs on the magnetization of the magnetic member 61, for example. Thereby, the magnetic domain walls of the magnetic member 61 move. The motion direction of the magnetic domain walls in the magnetic member follows the direction of each of the currents Ic1. The current Ic1 moves the magnetic domain walls in the direction D61 toward the other one end 61F. At this time, the moving velocities of the magnetic domain walls differs between the first magnetic domain wall 62a and the second magnetic domain wall 62b.

As shown in FIG. 3A, for example, when the current flows, the second magnetic domain wall 62b does not move substantially. On the other hand, the first magnetic domain wall 62a moves toward the second magnetic domain wall 62b at a high velocity. For example, the second magnetic domain wall 62b moves, the second magnetic domain 61b vanishes, and the first magnetic domain 61a and the third magnetic domain 61c are combined. The magnetizarion of the magnetic domain at the other one end 61F is oriented downward.

In an example shown in FIG. 3B, the magnetic member 61 has the second magnetic domain 61b, the third magnetic domain 61c, and a fourth magnetic domain 61d. A third magnetic domain wall 62c is located between the third magnetic domain 61c and the fourth magnetic domain 61d. A magnetization 61dM in the fourth magnetic domain 61d is downward. In such configuration, when the current Ic1 flows, the third magnetic domain wall 62c does not move substantially. On the other hand, the second magnetic domain wall 62b moves towards the other one end 61F at a high velocity. As a result, the magnetization at the other one end 61F is changed to orient upward.

Thus, in both cases of the case shown in FIG. 3A and the case shown in FIG. 3B, after the current Ic1 has flown in the direction D65, the magnetization becomes upward at the other one end 61F. That is, independently to the prior orientation of magnetization of the first magnetic domain 61a, the second magnetic domain 61b, the third magnetic domain 61c and the fourth magnetic domain 61d, the magnetization is controlled to be upward at the other one end 61F. In an other hand, the magnetization orientation at the one end 61E depends on the original magnetization orientation. For example, the magnetization orientation at the one end 61E is upward in the example shown in FIG. 3A, and downward in the example shown in FIG. 3B.

Figure 4A:
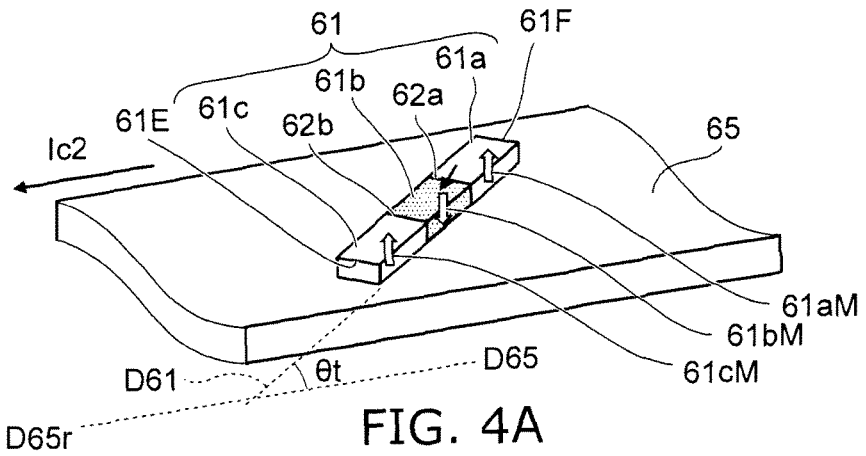
FIG. 4A and FIG. 4B are schematic perspective views illustrating operations in a magnetic memory device.
Figure 4B:
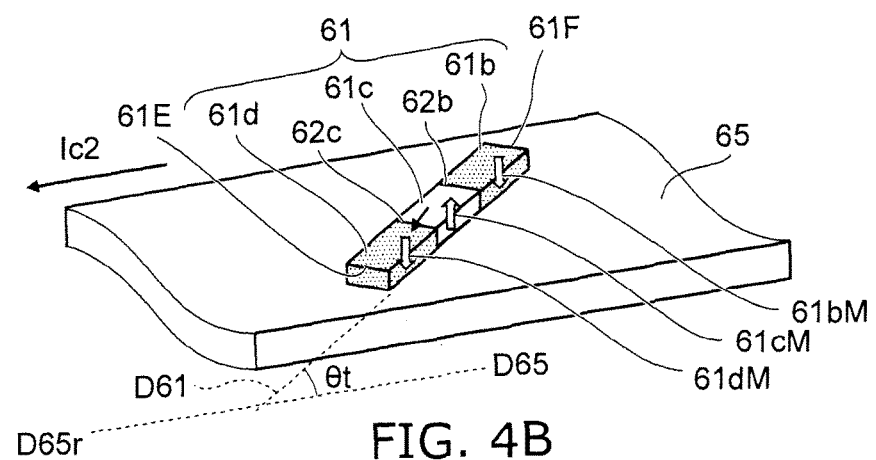

FIG. 4A and FIG. 4B are schematic perspective views illustrating operations in a magnetic memory device.

In examples shown in FIG. 4A and FIG. 4B, a direction of the current flown is reverse with respect to that in examples shown in FIG. 3A and FIG. 3B. The orientation of a current Ic2 is in a reverse direction D65r opposite to the direction D65.

By the current Ic2 flowing in the conductor 65, spin orbit torque occurs on the magnetization of the magnetic member 61, for example. The current Ic2 moves the magnetic domain walls in the direction D61 toward the one end 61E. At this time, the moving velocities of the magnetic domain walls differs between the first magnetic domain wall 62a and the second magnetic domain wall 62b.

As shown in FIG. 4A, for example, when the current Ic2 flows, the second magnetic domain wall 62b does not move substantially. On the other hand, the first magnetic domain wall 62a moves toward the second magnetic domain 62b at a high velocity. For example, the second magnetic domain 61b vanishes and the first magnetic domain 61a and the third magnetic domain 61c are combined. As a result, the magnetization of the magnetic domain at the one end 61E is oriented upward.

On the other hand, in the example shown in FIG. 4B, the magnetic member 61 has the second magnetic domain 61b, the third magnetic domain 61c, and the fourth magnetic domain 61d. In such configuration, when the current Ic2 flows, the second magnetic domain wall 62b does not move substantially. On the other hand, the third magnetic domain wall 62c moves toward the one end 61E at a high velocity. For example, the fourth magnetic domain 61d vanishes. As a result, the magnetization at the one end 61E is changed to orient downward.

Thus, in both cases of the case shown in FIG. 4A and the case shown in FIG. 4B, after the current Ic2 has flown in the reverse direction D65r, the magnetization becomes upward at the one end 61E. That is, independently to the prior orientation of magnetization of the first magnetic domain 61a, the second magnetic domain 61b, the third magnetic domain 61c and the fourth magnetic domain 61d, the magnetization is controlled to be upward at the one end 61E. In an other hand, the magnetization orientation at the one other end 61F depends on the original magnetization orientation. For example the magnetization orientation at the one other end 61F is upward in the example shown in FIG. 4A, and downward in the example shown in FIG. 4B.

Figure 5:
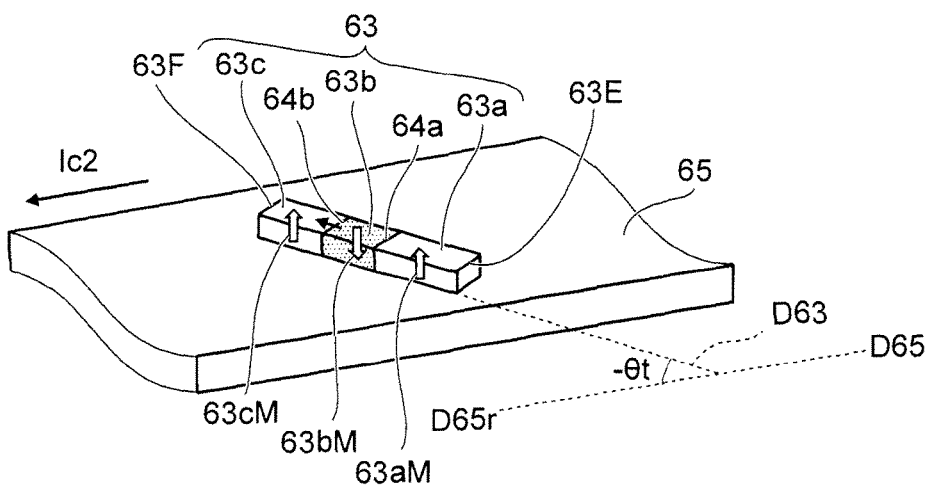
FIG. 5 is a schematic perspective view illustrating operations in a magnetic memory device.

FIG. 5 is a schematic perspective view illustrating operations in a magnetic memory device.

The conductor 65 extends along the direction D65. A magnetic member 63 extends along a direction D63 from one end 63E to other one end 63F. The direction D63 is inclined with respect to the direction D65. A difference of the direction D63 and the direction D65 is taken as a tilt angle −θt. The tilt angle −θt is opposite angle with respect to the tilt angle θt (see FIG. 4B, for example).

In the example shown in FIG. 5, the magnetic member 63 has a plurality of magnetic domains (a first magnetic domain 63a, a second magnetic domain 63b, a third magnetic domain 63c, etc.). A first magnetic domain wall 64a is located between the first magnetic domain 63a and the second magnetic domain 64b. A second magnetic domain wall 64b is located between the second magnetic domain 63b and the third magnetic domain 63c. In the example shown in FIG. 5, for example, a magnetization 63aM in the first magnetic domain 63a and a magnetization 63cM in the third magnetic domain 63c are upward. On the other hand, a magnetization 63bM in the second magnetic domain 63b is downward.

In such configuration, the current Ic2 of the reverse direction D65r flows in the conductor 65. The first magnetic domain wall 64a does not move substantially. The second magnetic domain wall 64b moves toward the other one end 63F at a high velocity. As a result, the magnetization at the other one end 63F is changed to orient downward.

For example, the configuration shown in FIG. 4A and the configuration shown in FIG. 5 are combined. The direction D61 which is the extending direction of the magnetic member 61 and the direction D63 of the extending direction of the magnetic member 63 are inclined with respect to the direction D65 which is the extending direction of the conductor 65. Then, the direction D61 and the direction D63 are opposite to each other. By such configuration, the direction of the magnetization can be controlled stably at an end of the magnetic member 61 and at an end of the magnetic member 63.

For example, the first extending portion 11 corresponds to the magnetic member 63. The first connection portion 11C corresponds to the other one end 63F. For example, the second extending portion 12 corresponds to the magnetic member 61. The second connection portion 12C corresponds to the other one end 61F.

The difference of such moving velocity, described with regard to FIG. 3A, FIG. 3B, FIG. 4A, FIG. 4B and, FIG. 5, changes depending on the tilt angle θt. For example, when the tilt angle θt is about 45 degrees, a large difference occurs in the moving velocity. For example, when the tilt angle θt is 0 degrees or 90 degrees, a difference is not generated in the moving velocity.

For example, for the configuration shown in FIG. 3A, FIG. 3B, FIG. 4A, and FIG. 4B, a first reference example is conceivable in which the direction D61 is parallel to the direction D65. In the first reference example, the magnetic domain wall moving velocities of mutually same grade are given to the magnetic member 61. Therefore, upward magnetization or downward magnetization is written in the magnetic member 61 at the location of the other one end 61F by same grade with the current Ic1. Therefore, the control of the magnetization direction at the other one end 61F is not obtained by the supplying of the current Ic1. Upward magnetization or downward magnetization is written in the magnetic member 61 at the location of the one end 61E by same grade with the current Ic2. Therefore, the control of the magnetization direction at the one end 61E is not obtained by the supplying of the current Ic2.

For example, for the configuration shown in FIG. 5, a second reference example is conceivable in which the direction D63 is parallel to the direction D65. In the second reference example, the domain wall moving velocities of mutually same grade are given to the magnetic member 63. Therefore, upward magnetization or downward magnetization is written in the magnetic member 63 at the location of the one end 63E by same grade with the current Ic2. Therefore, the control of the magnetization direction at the one end 63E is not obtained by the supplying of the current Ic2.

In embodiment, the first extending portion 11 extends along the first direction D1. The second extending portion 12 extends along the second direction D2. The conductive member 50 extends along the fourth direction D4. In addition, the first direction D1 is inclined with respect to the fourth direction D4. The second direction D2 is inclined with respect to the fourth direction D4. For example, the above-mentioned tilt angle θt is larger than 0 degrees and smaller than 90 degrees. Therefore, a difference occurs in the moving velocity of the magnetic domain walls.

For example, when a current is supplied in the conductive member 50, the characteristic of the movement of the magnetic domain wall in the first extending portion 11 differs from the characteristic of the movement of the magnetic domain wall in the second extending portion 12. The movement of the magnetic domain wall in the first extending portion 11 and the movement of the magnetic domain wall in the second extending portion 12 are different from each other, for example. Either of the movement of the magnetic domain wall in the first extending portion 11 or the movement of the magnetic domain wall in the second extending portion 12 is transferred to the third extending portion 13 with the priority. The transfer of the movement of the magnetic domain wall of the two extending portions can be selected by the direction of the current, for example, as described with regard to FIG. 3A, FIG. 3B, FIG. 4A), FIG. 4B, and FIG. 5.

FIG. 6A to FIG. 6D are schematic views illustrating operations in the magnetic memory device according to the first embodiment.

Figure 6A:
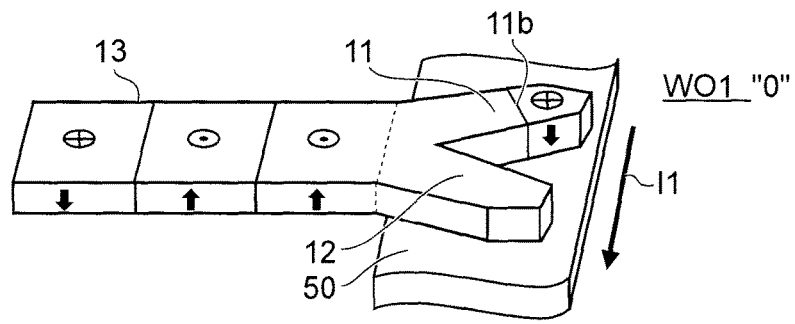
FIG. 6A to FIG. 6D are schematic views illustrating operations in the magnetic memory device according to the first embodiment.
Figure 6B:
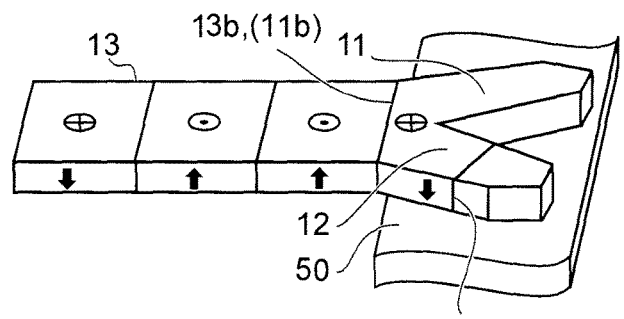
Figure 6C:
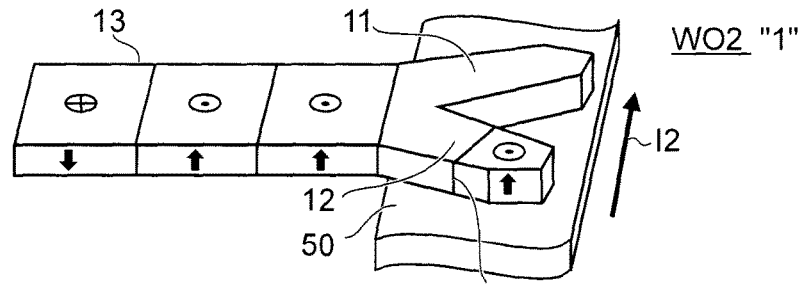
Figure 6D:
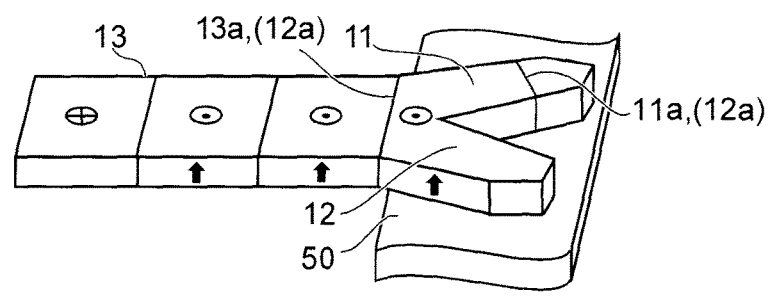

FIG. 6A illustrates a state prior to the first writing operation WO1. FIG. 6B illustrates a state after the first writing operation WO1. FIG. 6C lustrates a state prior to the second writing operation WO2. FIG. 6D illustrates a state after the second writing operation WO2.

As shown in FIG. 6A, the first current I1 flows. For example, the magnetic domain wall 11b of the first extending portion 11 moves toward the third extending portion 13 and the second extending portion 12. The magnetic domain wall 13b can be formed in the third extending portion 13, for example (see FIG. 6B). The magnetic domain wall 12b can be formed in the second extending portion 12, for example. The magnetic domain wall 12b of the second extending portion 12 moves in a direction away from the third extending portion 13. For example, the magnetization of the first extending portion 11 is transferred to the third extending portion 13.

Thereby, as shown in FIG. 6B, "downward" magnetization is written in the third extending portion 13.

On the other hand, as shown in FIG. 6C, the second current I2 flows. For example, the magnetic domain wall 12a of the second extending portion 12 moves toward the third extending portion 13 and the first extending portion 11. The magnetic domain wall 13a can be formed in the third extending portion 13, for example (see FIG. 6D). The magnetic domain wall 11a can be formed in the first extending portion 11, for example. The magnetic domain wall 11a of the first extending portion 11 moves in a direction away from the third extending portion 13. For example, the magnetization of the second extending portion 12 is transferred to the third extending portion 13.

Thereby, as shown in FIG. 6D, "upward" magnetization is written in the third extending portion 13.

Thus, mutually different magnetizations can be transferred to the third extending portion 13 by mutually different orientation currents. By mutually different orientation currents, mutually different information (0 or 1) can be written in the third extending portion 13. The initial presence of magnetic domain wall 11b or 11a is not a requirement since such magnetic domain wall is created during the supplying of the electrical current.

As already described, for example, a reference example is conceivable in which the first direction D1 and the second direction D2 are parallel to the fourth direction D4. In this reference example, the magnetic properties of mutually same grade are given to the third extending portion 13 from two extending portions. Therefore, upward magnetization or downward magnetization is written in the third extending portion 13 by same grade. Therefore, the writing is not stabilized.

On the other hand, in the embodiments, the first direction D1 and the second direction D2 are inclined with respect to the fourth direction D4. Thereby, the writing can be performed from either the first extending portion 11 or the second extending portion 12 with priority. A stable writing operation can be performed.

Hereinafter, examples of a shift operation is described.

Figure 7A:
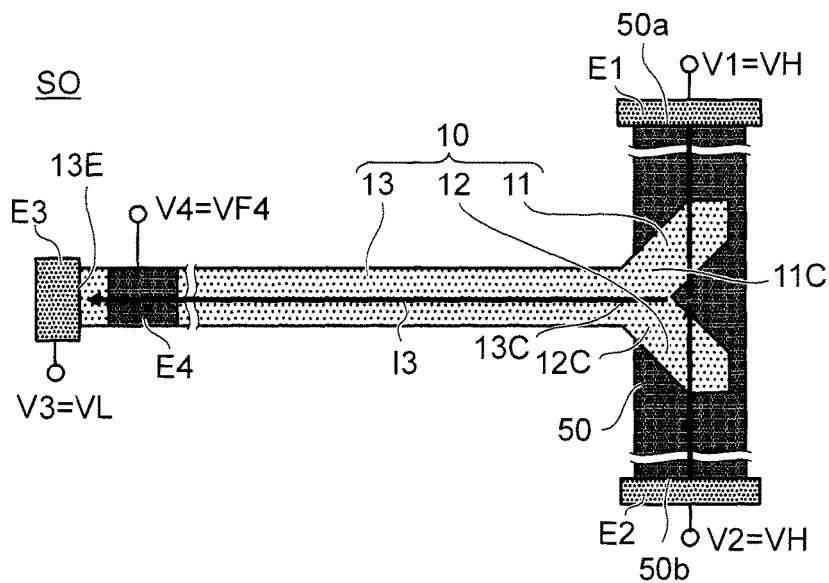
FIG. 7A and FIG. 7B are schematic views illustrating other operations in the magnetic memory device according to the first embodiment.
Figure 7B:
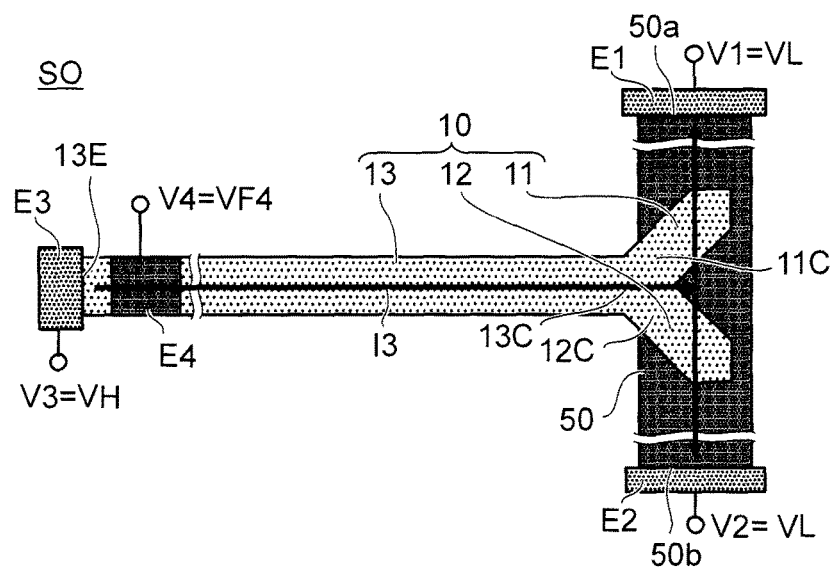

FIG. 7A and FIG. 7B are schematic views illustrating other operations in the magnetic memory device according to the first embodiment.

These figures illustrate two shift operations.

As shown in FIG. 7A and FIG. 7B, the third extending portion 13 has the third end portion 13E. The third connection portion 13C is located between the first connection portion 11C and the third end portion 13E. The third connection portion 13C is located between the second connection portion 12C and the third end portion 13E. The controller 70 is electrically connected with the third end portion 13E. In this example, the controller 70 is electrically connected to the third electrode E3.

The controller 70 supplies a third current I3 in a shift operation SO. The third current I3 flows between the third end portion 13E and the conductive member 50.

In the example of FIG. 7A, the third current I3 flows from the conductive member 50 toward the third end portion 13E. In the example of FIG. 7B, the third current I3 flows from the third end portion 13E toward the conductive member 50.

In the example of FIG. 7A, the first electrode E1 and the second electrode E2 are set at the high potential VH. The third electrode E3 is set at the low potential VL. In the example of FIG. 7B, the first electrode E1 and the second electrode E2 are set at the low potential VL. The third electrode E3 is set at the high potential VH. In these shift operations, the potential of the fourth electrode E4 is arbitrary. For example, the fourth electrode E4 may be at the floating potential VF4. By such shift operations, information (the magnetization) held in the third extending protion 13 shifts in the third extending portion 13 along the third direction D3.

Hereinafter, examples of a reading operation are described.

FIG. 8A, FIG. 8B, FIG. 9A, and FIG. 9B are schematic views illustrating other operations in the magnetic memory device according to the first embodiment.

As already described, the controller 70 is electrically connected with the second magnetic member 20. For example, the controller 70 is electrically connected with the fourth electrode E4. In a reading operation RO, a fourth current I4 is detected in the controller 70. The fourth current I4 flows in a current path including the second magnetic member 20 and the third extending portion 13.

Figure 8A:
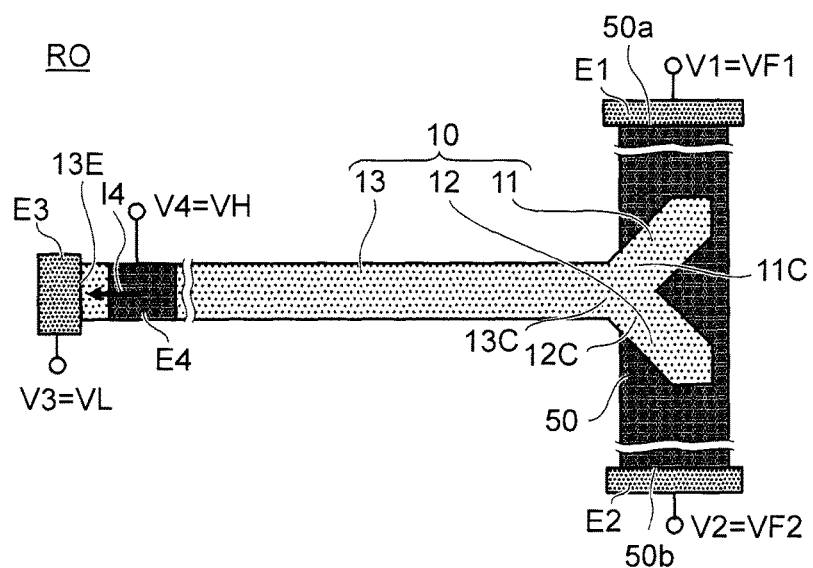
FIG. 8A and FIG. 8B are schematic views illustrating other operations in the magnetic memory device according to the first embodiment.
Figure 8B:
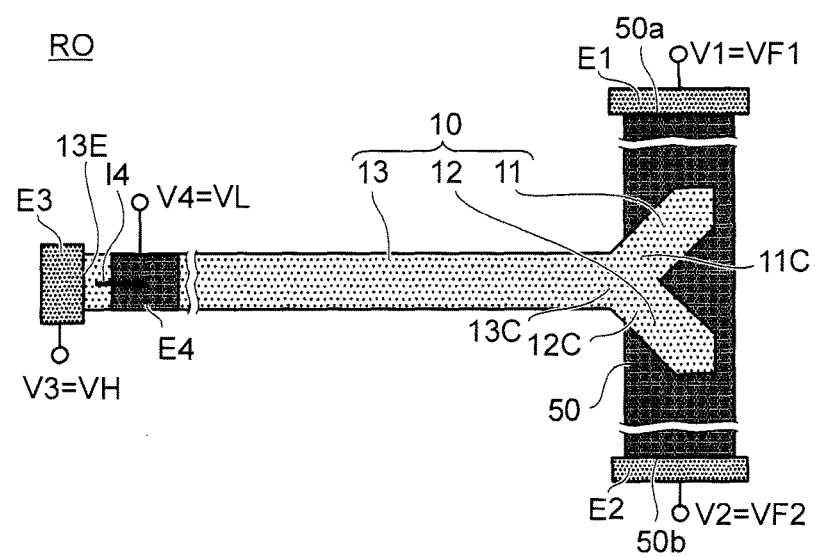

In the example of FIG. 8A, the fourth current I4 flows from the fourth electrode E4 toward the third electrode E3. For example, the fourth electrode E4 is set at the high potential VH. The third electrode E3 is set at the low potential VL. In the example of FIG. 8B, the fourth current I4 flows from the third electrode E3 toward the fourth electrode E4. For example, the fourth electrode E4 is set at the low potential VL. The third electrode E3 is set at the high potential VH. In these operations, the potentials of the first electrode E1 and the second electrode E2 are arbitrary. For example, the first electrode E1 may be set at a floating potential VF1. For example, the second electrode E2 may be set at a floating potential VF2.

Figure 9A:
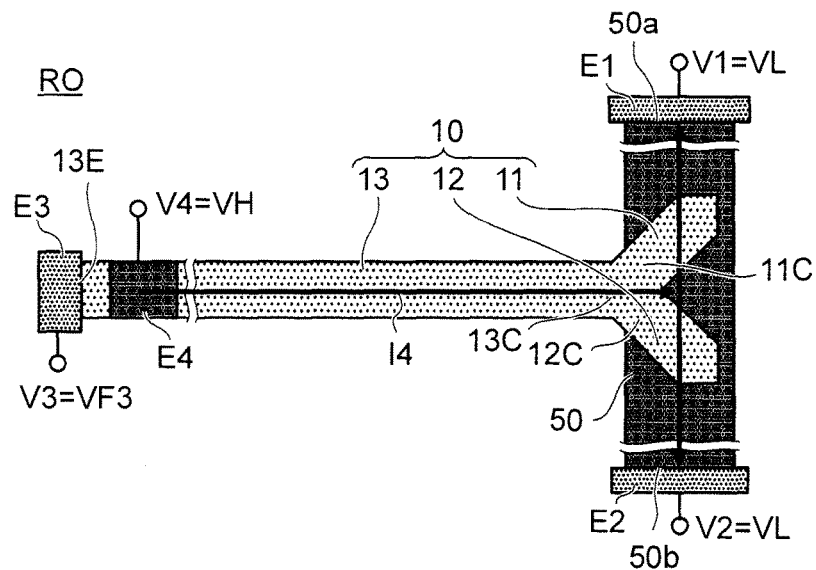
FIG. 9A and FIG. 9B are schematic views illustrating other operations in the magnetic memory device according to the first embodiment.
Figure 9B:
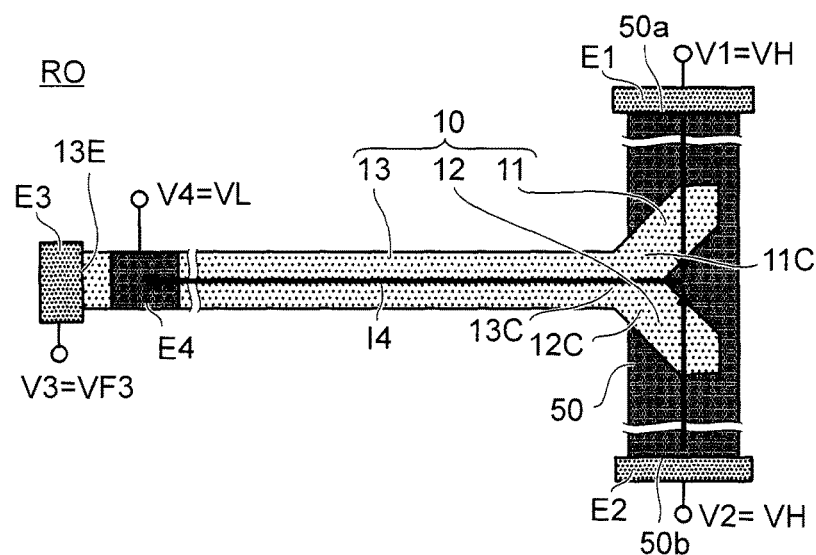

In the example of FIG. 9A, the fourth current I4 flows from the fourth electrode E4 toward the conductive member 50. For example, the fourth electrode E4 is set at the high potential VH. The first electrode E1 and the second electrode E2 are set at the low potential VL. In the example of FIG. 9B, the fourth current I4 flows from the conductive member 50 toward the fourth electrode E4. For example, the fourth electrode E4 is set at the low potential VL. The first electrode E1 and the second electrode E2 are set at the high potential VH. In these operations, the potential of the third electrode E3 is arbitrary. For example, the third electrode E3 may be set at the floating potential VF3.

For example, the third extending portion 13 has a region opposing the second magnetic member 20. An electrical resistance between the region and the second magnetic member 20 changes depending on the orientation of the magnetization of the region domain. For example, the information about the magnetization of the third extending portion 13 can be acquired by detecting the signal (at least one of current or voltage) according to the electrical resistance. The controller 70 outputs a plurality of signals corresponding to the electrical resistance. The plurality of signals correspond to the magnetization (information) in the third extending portion 13.

For example, the controller 70 outputs either a first signal or a second signal in the reading operation RO. The first signal is outputted after performing the first writing operation WO1. The second signal is outputted after performing the second writing operation WO2. The first signal differs from the second signal.

In embodiment, the conductive member 50 includes a metal. The metal includes at least one selected from the group consisting of tantalum and tungsten, for example. In such metals, a spin Hall angle is negative, for example. In such metals, the absolute value of the spin Hall angle is relatively large.

The metal included in the conductive member 50 may also includes at least one selected from the group consisting of platinum and gold, for example. In such metals, the spin Hall angle is positive, for example. In such metals, the absolute value of the spin Hall angle is relatively large.

A thickness of the conductive member 50 is not less than 0.5 nanometers and not more than 20 nanometers, for example.

In the embodiment, the first magnetic member 10 includes at least one selected from the group consisting of Iron (Fe), Cobalt (Co), and Nickel (Ni), for example. A thickness of the first extending portion 11 of the first magnetic member 10 is not less than 0.3 nanometers and not more than 20 nanometers. A thickness of the second extending portion 12 is not less than 0.3 nanometers and not more than 20 nanometers. Such thicknesses are lengths along the fifth direction D5. A thickness of the third extending portion 13 is not less than 0.3 nanometers and not more than 20 nanometers. This thickness is a length along a direction perpendicular to the third direction D3.

The second magnetic member 20 includes at least one selected from the group consisting of Iron (Fe), Cobalt (Co), and Nickel (Ni), for example. A thickness of the second magnetic member 20 is not less than 0.5 nanometers and not more than 50 nanometers, for example. This thickness is a length along a direction perpendicular to the third direction D3.

Figure 10:
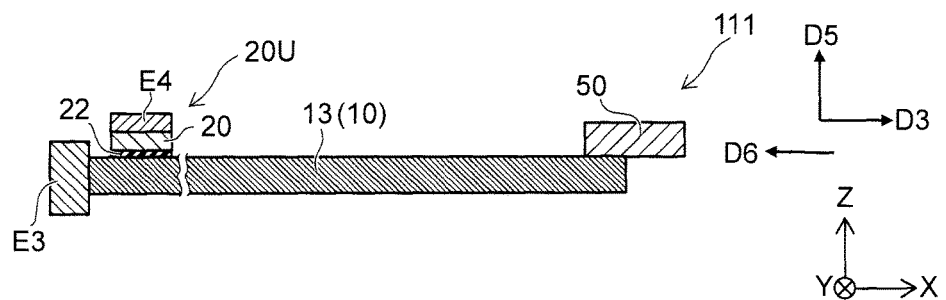
FIG. 10 is a schematic sectional view illustrating another magnetic memory device according to the first embodiment.

FIG. 10 is a schematic sectional view illustrating another magnetic memory device according to the first embodiment.

FIG. 10 is a sectional view corresponding to A1-A2 line in FIG. 1A. As shown in FIG. 10, in other magnetic memory device 111 according to the first embodiment, the second magnetic member 20 is located on the first magnetic member 10. In addition, the conductive member 50 is also located on the first magnetic member 10. Except this, the configuration of the magnetic memory device 111 is the same as that of the magnetic memory device 110. The stable writing can be performed also in the magnetic memory device 111. The stable operation becomes possible.

Figure 11:
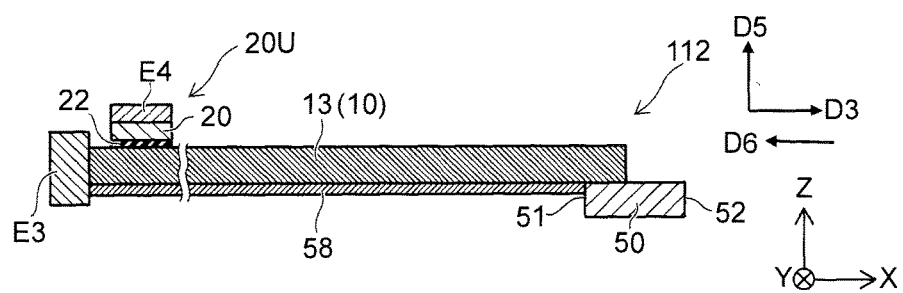
FIG. 11 is a schematic sectional view illustrating another magnetic memory device according to the first embodiment.

FIG. 11 is a schematic sectional view illustrating another magnetic memory device according to the first embodiment.

FIG. 11 is a sectional view corresponding to A1-A2 line in FIG. 1 (a).

As shown in FIG. 11, in other magnetic memory device 112 according to the first embodiment, a conductive layer 58 is further provided. Except this, the configuration of the magnetic memory device 112 is the same as that of the magnetic memory device 110.

The conductive layer 58 is provided along the third extending portion 13. The conductive layer 58 is electrically connected with the third extending portion 13. Between the conductive layer 58 and the second magnetic member 20, a part of third extending portion 13 is located. By the conductive layer 58, an electrical resistance of the third extending portion 13 can be reduced. For example, a noise is suppressed. The stable operation is obtained. The stable writing can be performed also in the magnetic memory device 112.

Figure 12:
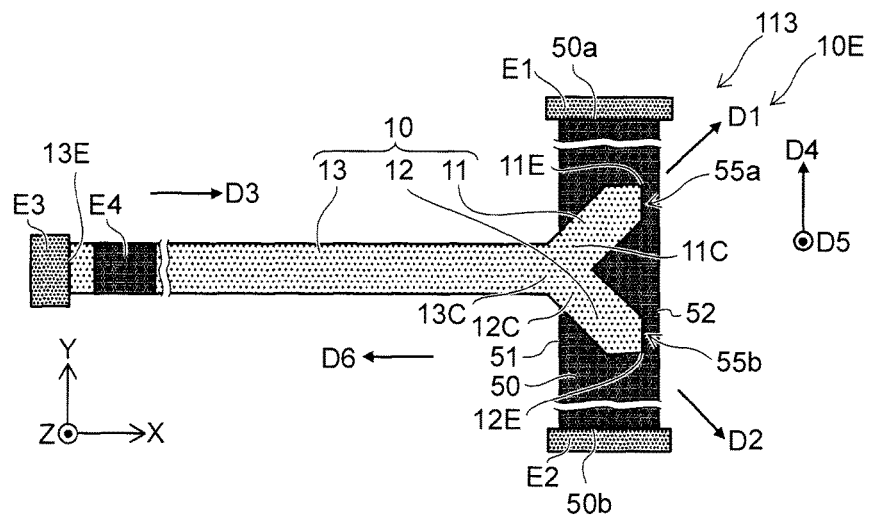
FIG. 12 is a schematic plan view illustrating another magnetic memory device according to the first embodiment.

FIG. 12 is a schematic plan view illustrating another magnetic memory device according to the first embodiment.

FIG. 12 is a plan view corresponding to FIG. 1A.

As shown in FIG. 12, as other magnetic memory device 113 according to the first embodiment, the first side 51 may overlap the third extending portion 13 in the fifth direction D5. Except this, the configuration of the magnetic memory device 113 is the same as that of the magnetic memory device 110. The stable writing can be performed also in the magnetic memory device 113. The stable operation becomes possible.

Figure 13:
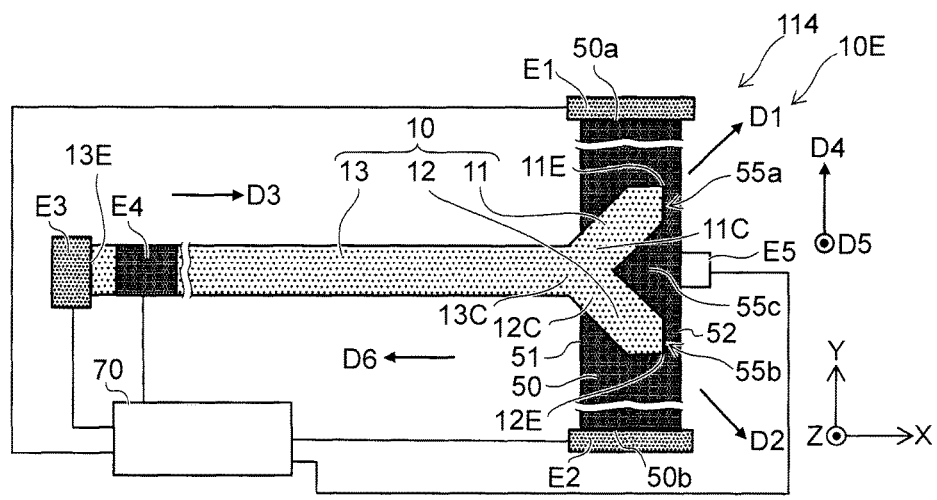
FIG. 13 is a schematic plan view illustrating another magnetic memory device according to the first embodiment.

FIG. 13 is a schematic plan view illustrating another magnetic memory device according to the first embodiment.

FIG. 13 is a plan view corresponding to FIG. 1A.

As shown in FIG. 13, an intermediate electrode E5 is provided in another magnetic memory device 114 according to a first embodiment. Except this, the configuration of the magnetic memory device 114 is the same as that of the magnetic memory device 110.

As already described, the conductive member 50 includes the first end portion 50a and the second end portion 50b. The overlapping portion 55 is located between the first end portion 50a and the second end portion 50b. A direction from the second end portion 50b toward the first end portion 50a is along the fourth direction D4. The overlapping portion 55 includes the first overlapping region 55a and the second overlapping region 55b. The first overlapping region 55a overlaps at least a part of the first extending portion 11 in the fifth direction D5. The second overlapping region 55b overlaps at least a part of the second extending portion 12 in the fifth direction D5. The conductive member 50 further includes an intermediate region 50c. The intermediate region 50c is located between the first overlapping region 55a and the second overlapping region 55b in the fourth direction D4.

The controller 70 is electrically connected with the first end portion 50a, the second end portion 50b, and the intermediate region 50c. The intermediate electrode E5 is electrically connected with the intermediate region 50c. The controller 70 is electrically connected with the first electrode E1, the second electrode E2, and the intermediate electrode E5.

In the magnetic memory device 114, by using the intermediate electrode E5, a writing operation with more stability can be performed.

Figure 14A:
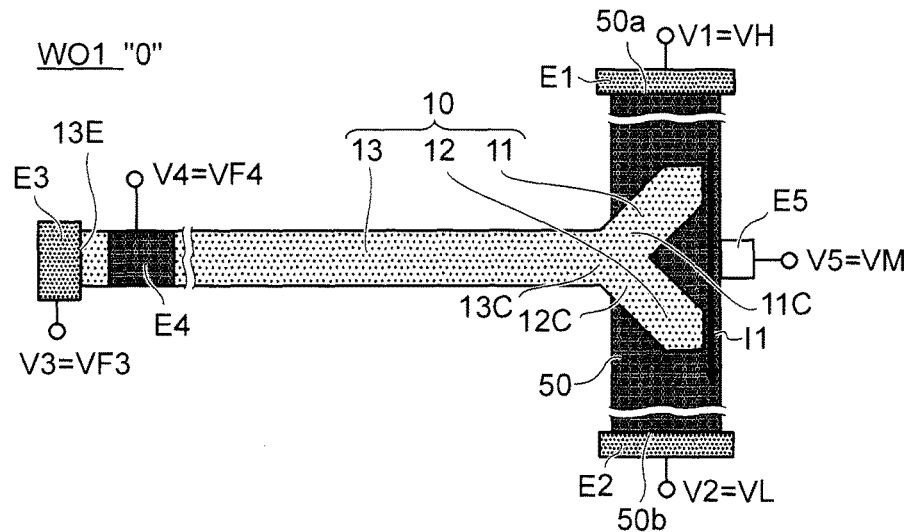
FIG. 14A and FIG. 14B are schematic views illustrating operations in the other magnetic memory device according to the first embodiment.
Figure 14B:
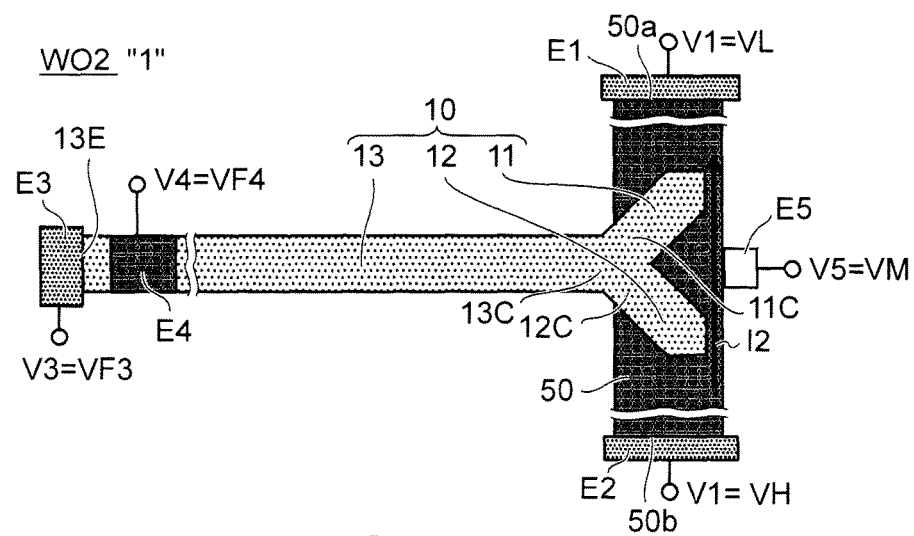

FIG. 14A and FIG. 14B are schematic views illustrating operations in other magnetic memory device according to a first embodiment.

FIG. 14A corresponds to the first writing operation WO1. FIG. 14B corresponds to the second writing operation WO2.

As shown in FIG. 14A, the controller 70 supplies the first current I1 to the conductive member 50 in the first writing operation WO1. As shown in FIG. 14B, the controller 70 supplies the second current I2 to the conductive member 50 in the second writing operation WO2.

For example, in the first writing operation WO1, the controller 70 sets the first electrode E1 at the high potential VH. The controller 70 sets the second electrode E2 at the low potential VL. The controller 70 sets the intermediate electrode E5 at an intermediate potential VM. The high potential VH is higher than the intermediate potential VM. The intermediate potential VM is higher than the low potential VL.

On the other hand, in the second writing operation WO2, the controller 70 sets the first electrode E1 at the low potential VL. The controller 70 sets the second electrode E2 at the high potential VH. The controller 70 sets the intermediate electrode E5 at the intermediate potential VM.

Thus, the controller 70 makes the first potential of the first end portion 50a higher than the third potential of the intermediate region 50c in the first writing operation WO1. The controller 70 makes the second potential of the second end portion 50b lower than the third potential in the first writing operation WO1.

On the other hand, the controller 70 makes the first potential lower than the third potential in the second writing operation WO2. The controller 70 makes the second potential higher than the third potential in the second writing operation WO2.

Thereby, the orientation of the current in the first overlapping region 55a is stabilized, for example. For example, the orientation of the current in the second overlapping region 55b is stabilized. Thereby, the magnetic action to the first extending portion 11 from the conductive member 50 is stabilized, for example. For example, the magnetic action to the second extending portion 12 from the conductive member 50 is stabilized. For example, a stable writing can be performed.

The first state formed in the third extending portion 13 in the first writing operation WO1 differs from the second state formed in the third extending portion 13 in the second writing operation WO2 in this case too. The different states are the states of magnetization, for example. The different states correspond to memory information. A stable writing can be performed also in the magnetic memory device 114. The stable operation becomes possible.

Hereinafter, examples of the shift operation in the magnetic memory device 114 are described.

Figure 15A:
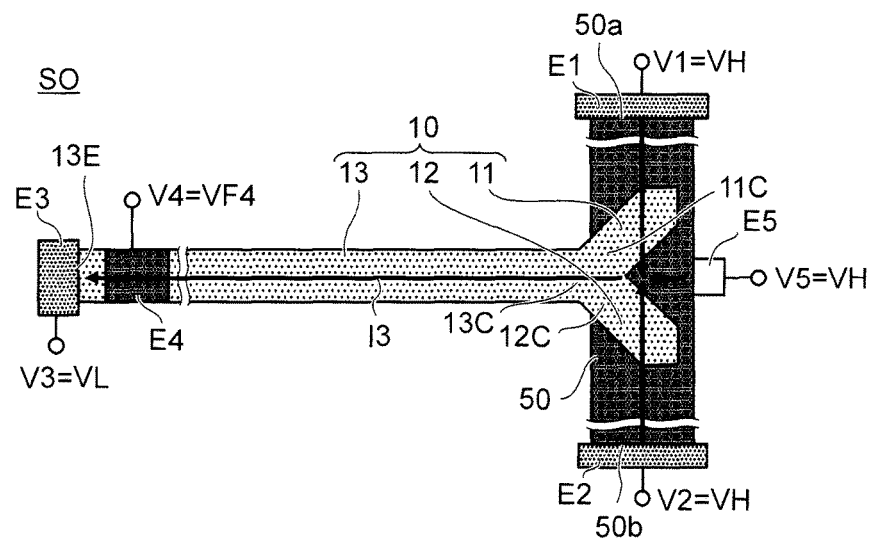
FIG. 15A and FIG. 15B are schematic views illustrating other operations in the other magnetic memory device according to the first embodiment.
Figure 15B:
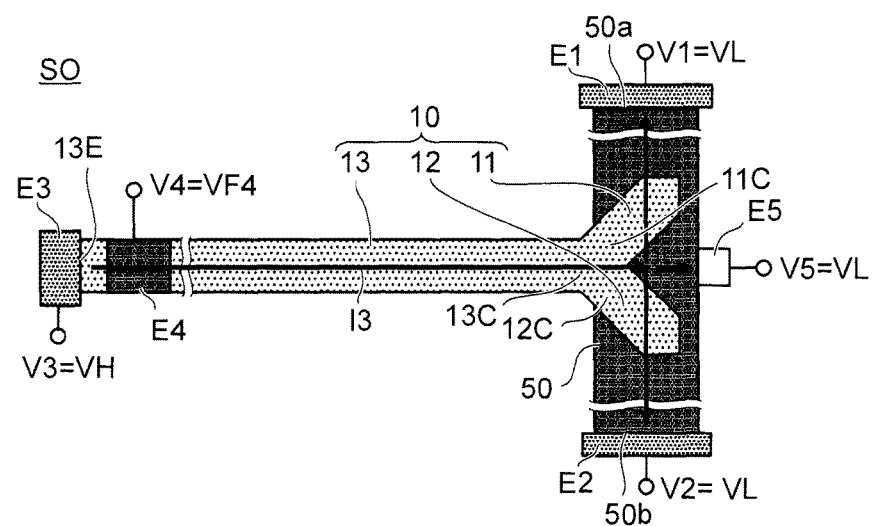

FIG. 15A and FIG. 15B are schematic views illustrating other operations in the other magnetic memory device according to the first embodiment.

These Figures illustrate two shift operations.

As shown in FIG. 15A, in an example of the shift operation, the third current I3 flows from the conductive member 50 toward the third end portion 13E.

As shown in FIG. 15B, in another example of the shift operation, the third current I3 flows from the third end portion 13E toward the conductive member 50.

In the example of FIG. 15A, the first electrode E1, the second electrode E2, and the intermediate electrode E5 are set at the high potential VH. The third electrode E3 is set at the low potential VL. In the example of FIG. 15B, the first electrode E1, the second electrode E2, and the intermediate electrode E5 are set at the low potential VL. The third electrode E3 is set at the high potential VH.

Hereinafter, examples of the reading operation are described.

FIG. 16A, FIG. 16B, FIG. 17A, and FIG. 17B are schematic views illustrating other operations in the other magnetic memory device according to the first embodiment.

Figure 16A:
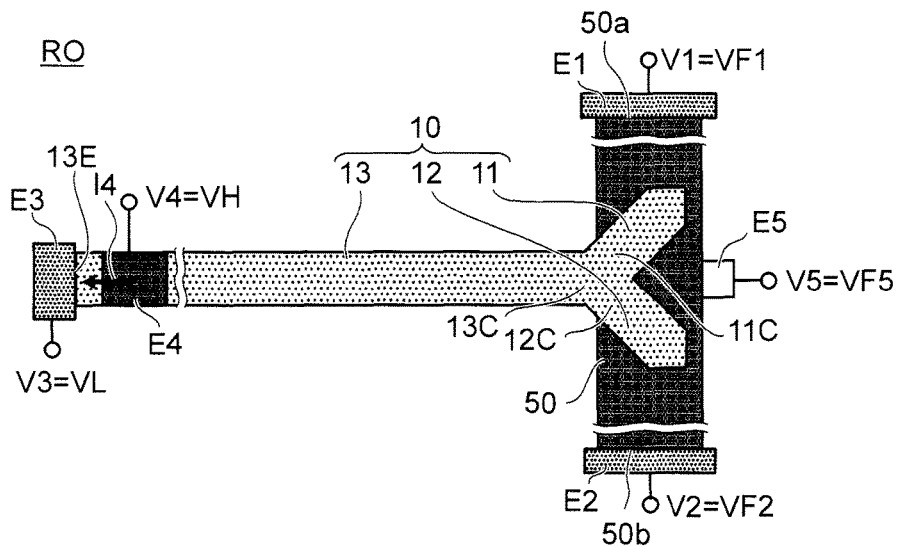
FIG. 16A and FIG. 16B are schematic views illustrating other operations in the other magnetic memory device according to the first embodiment.
Figure 16B:
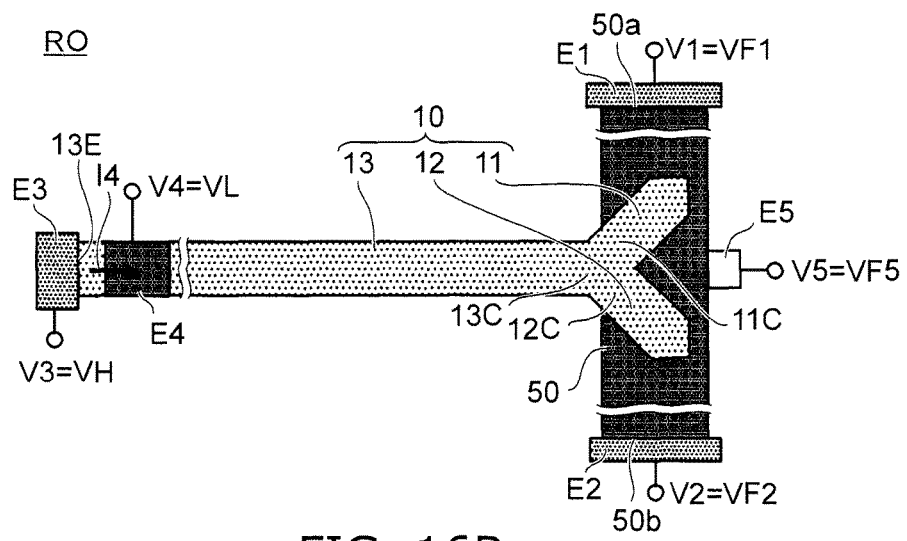

In the example of FIG. 16A, the fourth electrode E4 is set at the high potential VH. The third electrode E3 is set at the low potential VL. In the example of FIG. 16B, the fourth electrode E4 is set at the low potential VL. The third electrode E3 is set at the high potential VH.

Figure 17A:
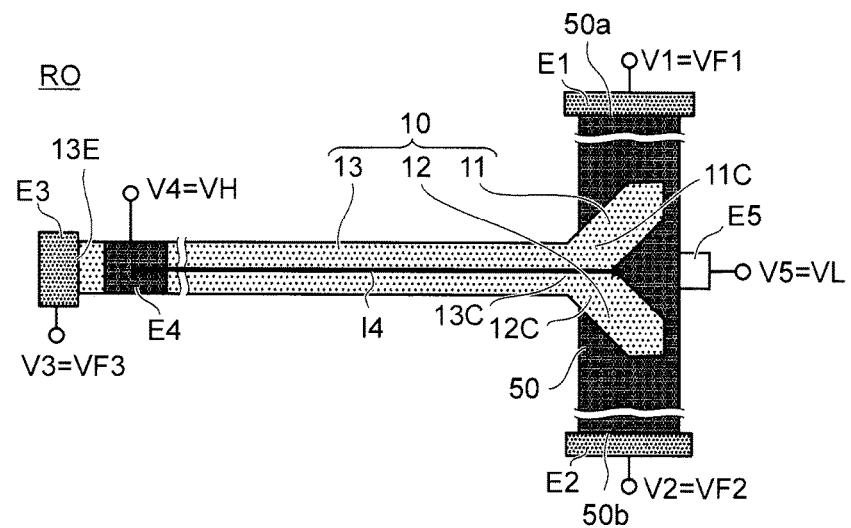
FIG. 17A and FIG. 17B are schematic views illustrating other operations in the other magnetic memory device according to the first embodiment.
Figure 17B:
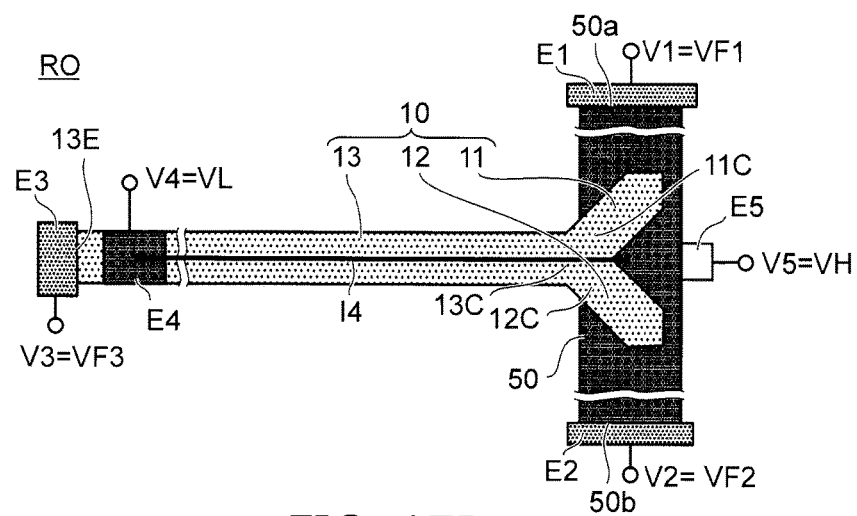

In the example of FIG. 17A, the fourth electrode E4 is set at the high potential VH. The intermediate electrode E5 is set at the low potential VL. In the example of FIG. 17B, the fourth electrode E4 is set at the low potential VL. The intermediate electrode E5 is set at the high potential VH.

Also in this case, the electrical resistance between the third extending portion 13 and the second magnetic member 20 changes depending on the orientation of the magnetization of the third extending portion 13, for example. For example, a signal (at least one of current and voltage) according to the electrical resistance is detected. The controller 70 outputs a plurality of signals (a first signal or a second signal) corresponding to the electrical resistance. The plurality of signals correspond to the magnetization (information) in the third extending portion 13.

Second Embodiment

Figure 18:
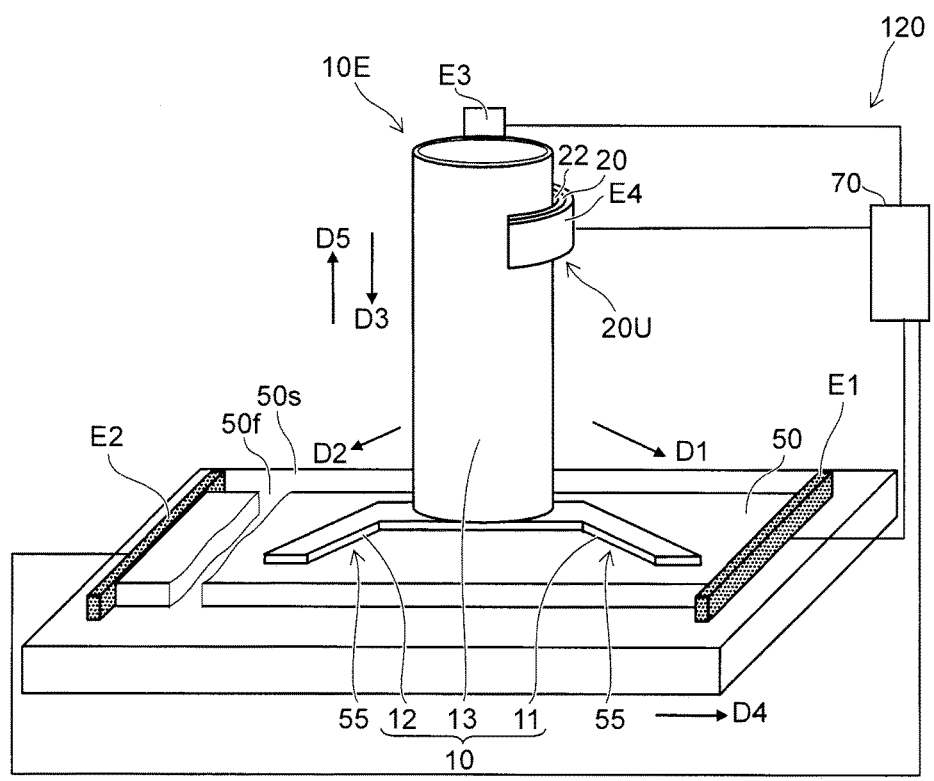
FIG. 18 is a schematic perspective view illustrating a magnetic memory device according to a second embodiment.

FIG. 18 is a schematic perspective view illustrating a magnetic memory device according to a second embodiment.

As shown in FIG. 18, a magnetic memory device 120 according to the second embodiment also includes the first magnetic member 10, the conductive member 50, and the second magnetic member 20. In this example, the magnetic memory device 120 further includes the controller 70. In the magnetic memory device 120, the third extending portion 13 has a tubular configuration extending along the third direction D3. Further, a substrate 50s is provided. The substrate 50s has a face 50f (for example, upper surface). The conductive member 50 is provided on the face 50f. The at least a part of the first extending portion 11 and the at least a part of the second extending portion 12 are provided on the conductive member 50. The third extending portion 13 is provided on at least a part of the at least a part of the first extending portion 11, and on at least a part of the at least a part of the second extending portion 12. In this example, the third direction D3 is along the fifth direction D5. The third direction D3 is substantially perpendicular to the face 50f, for example. An angle between the third direction D3 and the face 50f is not less than 85 degrees and not more than 95 degrees, for example. Thus, the third extending portion 13 extends along a direction perpendicular to the substrate 50s. Except this, the configuration of the magnetic memory device 120 is the same as that of the magnetic memory device 110.

Also in the magnetic memory device 120, the operation described about the magnetic memory device 110 is performed.

The stable writing can be performed also in the magnetic memory device 120. The stable operation becomes possible.

The embodiments may include the following configuration (for example, "technical idea").

(Configuration 1)

A magnetic memory device, including:

a first magnetic member including a first extending portion, a second extending portion, and a third extending portion, the first extending portion extending along a first direction, the second extending portion extending along a second direction different from the first direction, the third extending portion including a third connection portion connected with the first extending portion and the second extending portion, the third extending portion extending along a third direction;

a conductive member extending along a fourth direction, the first direction being inclined with respect to the fourth direction, the second direction being inclined with respect to the fourth direction, the conductive member including an overlapping portion, the overlapping portion overlapping at least a part of the first extending portion and at least a part of the second extending portion in a fifth direction, the fifth direction crossing the first direction, the second direction and the fourth direction, the conductive member including a metal; and a second magnetic member, a direction from the third extending portion toward the second magnetic member crossing the third direction.

(Configuration 2)

The magnetic memory device according to configuration 1, wherein the conductive member has a first side extending along the fourth direction and a second side extending along the fourth direction, a position of the first side in a sixth direction is located between a position of the third extending portion in the sixth direction and a position of the second side in the sixth direction, the sixth direction crosses the first direction, the second direction and the fourth direction, and the sixth direction is substantially perpendicular to the fifth direction.

(Configuration 3)

The magnetic memory device according to configuration 2, wherein the first extending portion includes a first connection portion and a first end, the second extending portion includes a second connection portion and a second end, the first connection portion is connected with the third connection portion, the second connection portion is connected with the third connection portion, the first connection portion is positioned between the third connection portion and the first end, the second connection portion is positioned between the third connection portion and the second end, a position of the first end in the sixth direction is between the position of the first side in the sixth direction and the position of the second side in the sixth direction, and a position of the second end in the sixth direction is between the position of the first side in the sixth direction and the position of the second side in the sixth direction.

(Configuration 4)

The magnetic memory device according to one of configurations 1 to 3, wherein a difference between a first angle and a second angle is not more than 10 degrees, the first angle is between the first direction and the fourth direction, and the second angle is between the second direction and a reverse direction of the fourth direction.

(Configuration 5)

The magnetic memory device according to one of configurations 1 to 3, wherein a first angle between the first direction and the fourth direction is not less than 10 degrees and not more than 80 degrees, and a second angle between the second direction and a reverse direction of the fourth direction is not less than 10 degrees and not more than 80 degrees.

(Configuration 6)

The magnetic memory device according to one of configurations 1 to 5, wherein a difference between a third angle and a fourth angle is not more than 10 degrees, the third angle is between the first direction and the third direction, and the fourth angle is between the second direction and the third direction.

(Configuration 7)

The magnetic memory device according to one of configurations 1 to 6, further comprising: a controller, the conductive member including a first end portion and a second end portion, the overlapping portion being provided between the first end portion and the second end portion, a direction from the second end portion toward the first end portion is along the fourth direction, the controller being electrically connected with the first end portion and the second end portion, the controller being configured to provide a first current to the conductive member in a first writing operation and to provide a second current to the conductive member in a second writing operation, a direction of the first current being from the first end portion toward the second end portion, a direction of the second current being from the second end portion toward the first end portion, a first state formed in the third extending portion in the first writing operation is different from a second state formed in the third extending portion in the second writing operation.

(Configuration 8)

The magnetic memory device according to one of configurations 1 to 6, further comprising a controller, the conductive member including a first end portion and a second end portion, the overlapping portion being provided between the first end portion and the second end portion, a direction from the first end portion toward the second end portion is along the fourth direction, the overlapping portion including:

a first overlapping region overlapping the at least the part of the first extending portion in the fifth direction; and a second overlapping region overlapping the at least the part of the second extending portion in the fifth direction, the conductive member including an intermediate region located between the first overlapping region and the second overlapping region, the controller being electrically connected with the first end portion, the second end portion and the intermediate region, the controller being configured to make a first electric potential of the first end portion higher than a third electric potential of the intermediate region in a first writing operation and to make a second electric potential of the second end portion lower than the third electric potential in the first writing operation, to make the first electric potential lower than the third electric potential in a second writing operation and to make the second electric potential higher than the third electric potential in the second writing operation, a first state formed in the third extending portion in the first writing operation being different from a second state formed in the third extending portion in the second writing operation.

(Configuration 9)

The magnetic memory device according to one of configurations 7 and 8, wherein the third extending portion further includes a third end portion, the third connection portion is positioned between the first connection portion and the third end portion, the controller is further electrically connected with the third end portion, the controller is configured to supply a third current flowing between the third end portion and the conductive member in a shift operation.

(Configuration 10)

The magnetic memory device according to one of configurations 7 to 9, wherein the controller is further electrically connected with the second magnetic member, the controller is configured to output either one of a first signal and a second signal in a reading operation, the first signal is outputted after the first writing operation is performed, the second signal is outputted after the second writing operation is performed, and the first signal is different from the second signal.

(Configuration 11)

The magnetic memory device according to one of configurations 1 to 10, wherein the overlapping portion physically contacts the at least the part of the first extending portion and the at least the part of the second extending portion.

(Configuration 12)

The magnetic memory device according to one of configurations 1 to 11, wherein the metal includes at least one selected from the group consisting of Tantalum and Tungsten.

(Configuration 13)

The magnetic memory device according to one of configurations 1 to 11, wherein the metal includes at least one selected from the group consisting of Platinum and Gold.

(Configuration 14)

The magnetic memory device according to one of configurations 1 to 13, wherein the third direction is along the fifth direction.

(Configuration 15)

The magnetic memory device according to one of configurations 1 to 14, wherein the third extending portion has a pipe configuration extending along the third direction.

(Configuration 16)

The magnetic memory device according to one of configurations 1 to 15, further comprising: a substrate having a face, the conductive member being provided on the face, the at least the part of the first extending portion and the at least the part of the second extending portion being provided on the conductive member, the third extending portion being provided on a part of the at least the part of the first extending portion and a part of the at least the part of the second extending portion, and the third direction being substantially perpendicular to the face.

(Configuration 17)

The magnetic memory device according to one of configurations 1 to 16, further comprising: an intermediate member being provided between the second magnetic member and the third extending portion.

(Configuration 18)

The magnetic memory device according to configuration 17, wherein the intermediate member includes a magnesium oxide.

(Configuration 19)

The magnetic memory device according to one of configurations 1 to 18, wherein the first magnetic member includes at least one selected form the group consisting of Iron, Cobalt, and Nickel.

According to embodiment, the magnetic memory device in which the stable operation is possible can be provided.

In the specification of the application, "a state of electrically connected" includes a state where a plurality of electric conductors contact physically with each other and a current flows between the plurality of electric conductors. "A state of electrically connected" includes a state where another electric conductor is inserted between the plurality of electric conductors and a current flows between the plurality electric conductors. "A state of electrically connected" includes a state where an electric element (switch element, such as a transistor etc.) is inserted between the plurality of electric conductors and a state where the current flows between the plurality of electric conductors can be formed.

In the specification of the application, "perpendicular" and "parallel" refer to not only strictly perpendicular and strictly parallel but also include, for example, the fluctuation due to manufacturing processes, etc. It is sufficient to be substantially perpendicular and parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic member, conductive members, intermediate members, and controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a first magnetic member including a first extending portion, a second extending portion, and a third extending portion, the first extending portion extending along a first direction, the second extending portion extending along a second direction different from the first direction, the third extending portion including a third connection portion connected with the first extending portion and the second extending portion, the third extending portion extending along a third direction;
   a conductive member extending along a fourth direction, the first direction being inclined with respect to the fourth direction, the second direction being inclined with respect to the fourth direction, the conductive member including an overlapping portion, the overlapping portion overlapping at least a part of the first extending portion and at least a part of the second extending portion in a fifth direction, the fifth direction crossing the first direction, the second direction and the fourth direction, the conductive member including a metal; and
   a second magnetic member, a direction from the third extending portion toward the second magnetic member crossing the third direction.

2. The device according to claim 1, wherein
   the conductive member has a first side extending along the fourth direction and a second side extending along the fourth direction,
   a position of the first side in a sixth direction is located between a position of the third extending portion in the sixth direction and a position of the second side in the sixth direction,
   the sixth direction crosses the first direction, the second direction and the fourth direction, and
   the sixth direction is substantially perpendicular to the fifth direction.

3. The device according to claim 2, wherein
   the first extending portion includes a first connection portion and a first end,
   the second extending portion includes a second connection portion and a second end,
   the first connection portion is connected with the third connection portion,
   the second connection portion is connected with the third connection portion, the first connection portion is positioned between the third connection portion and the first end, the second connection portion is positioned between the third connection portion and the second end, a position of the first end in the sixth direction is between the position of the first side in the sixth direction and the position of the second side in the sixth direction, and a position of the second end in the sixth direction is between the position of the first side in the sixth direction and the position of the second side in the sixth direction.

4. The device according to claim 1, wherein
a difference between a first angle and a second angle is not more than 10 degrees,
the first angle is between the first direction and the fourth direction, and
the second angle is between the second direction and a reverse direction of the fourth direction.

5. The device according to claim 1, wherein
a first angle between the first direction and the fourth direction is not less than 10 degrees and not more than 80 degrees, and
a second angle between the second direction and a reverse direction of the fourth direction is not less than 10 degrees and not more than 80 degrees.

6. The device according to claim 1, wherein
a difference between a third angle and a fourth angle is not more than 10 degrees,
the third angle is between the first direction and the third direction, and
the fourth angle is between the second direction and the third direction.

7. The device according to claim 1, further comprising: a controller,
the conductive member including a first end portion and a second end portion, the overlapping portion being provided between the first end portion and the second end portion, a direction from the second end portion toward the first end portion is along the fourth direction,
the controller being electrically connected with the first end portion and the second end portion,
the controller being configured to provide a first current to the conductive member in a first writing operation and to provide a second current to the conductive member in a second writing operation,
a direction of the first current being from the first end portion toward the second end portion,
a direction of the second current being from the second end portion toward the first end portion,
a first state formed in the third extending portion in the first writing operation is different from a second state formed in the third extending portion in the second writing operation.

8. The device according to claim 1, further comprising: a controller,
the conductive member including a first end portion and a second end portion, the overlapping portion being provided between the first end portion and the second end portion, a direction from the first end portion toward the second end portion is along the fourth direction,
the overlapping portion including:
a first overlapping region overlapping the at least the part of the first extending portion in the fifth direction; and
a second overlapping region overlapping the at least the part of the second extending portion in the fifth direction,
the conductive member including an intermediate region located between the first overlapping region and the second overlapping region,
the controller being electrically connected with the first end portion, the second end portion and the intermediate region,
the controller being configured to make a first electric potential of the first end portion higher than a third electric potential of the intermediate region in a first writing operation and to make a second electric potential of the second end portion lower than the third electric potential in the first writing operation, to make the first electric potential lower than the third electric potential in a second writing operation and to make the second electric potential higher than the third electric potential in the second writing operation,
a first state formed in the third extending portion in the first writing operation being different from a second state formed in the third extending portion in the second writing operation.

9. The device according to claim 7, wherein
the third extending portion further includes a third end portion,
the third connection portion is positioned between the first connection portion and the third end portion,
the controller is further electrically connected with the third end portion,
the controller is configured to supply a third current flowing between the third end portion and the conductive member in a shift operation.

10. The device according to claim 7, wherein
the controller is further electrically connected with the second magnetic member,
the controller is configured to output either one of a first signal and a second signal in a reading operation,
the first signal is outputted after the first writing operation is performed,
the second signal is outputted after the second writing operation is performed, and
the first signal is different from the second signal.

11. The device according to claim 1, wherein
the overlapping portion physically contacts the at least the part of the first extending portion and the at least the part of the second extending portion.

12. The device according to claim 1, wherein the metal includes at least one selected from the group consisting of Tantalum and Tungsten.

13. The device according to claim 1, wherein the metal includes at least one selected from the group consisting of Platinum and Gold.

14. The device according to claim 1, wherein the third direction is along the fifth direction.

15. The device according to claim 1, wherein the third extending portion has a pipe configuration extending along the third direction.

16. The device according to claim 1, further comprising: a substrate having a face,
the conductive member being provided on the face,
the at least the part of the first extending portion and the at least the part of the second extending portion being provided on the conductive member, the third extending portion being provided on a part of the at least the part of the first extending portion and a part of the at least the part of the second extending portion, and the third direction being substantially perpendicular to the face.

17. The device according to claim 1, further comprising:
an intermediate member being provided between the second magnetic member and the third extending portion.

18. The device according to claim 17, wherein the intermediate member includes a magnesium oxide.

19. The device according to claim 1, wherein the first magnetic member includes at least one selected form the group consisting of Iron, Cobalt, and Nickel.

\* \* \* \* \*